(12) United States Patent
Wollesen

(10) Patent No.: US 6,664,797 B1
(45) Date of Patent: Dec. 16, 2003

(54) METHOD FOR PROFILING SEMICONDUCTOR DEVICE JUNCTIONS USING A VOLTAGE CONTRAST SCANNING ELECTRON MICROSCOPE

(75) Inventor: Donald L. Wollesen, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 48 days.

(21) Appl. No.: 09/696,744

(22) Filed: Oct. 26, 2000

Related U.S. Application Data

(60) Provisional application No. 60/162,141, filed on Oct. 29, 1999.

(51) Int. Cl.[7] ............................................. G01R 1/04
(52) U.S. Cl. ...................................... 324/751; 324/765
(58) Field of Search ................................ 324/750, 751, 324/752, 765, 96, 769; 438/14, 18; 257/48; 382/145, 149; 250/492.1, 492.3; 430/3

(56) References Cited

U.S. PATENT DOCUMENTS

| | | | | | |
|---|---|---|---|---|---|
| 4,456,879 A | * | 6/1984 | Kleinknecht | ............... | 324/71.5 |
| 4,703,260 A | * | 10/1987 | Beha et al. | ............... | 324/752 |
| 4,837,506 A | * | 6/1989 | Patterson | ............... | 250/311 |
| 5,523,694 A | * | 6/1996 | Cole, Jr. | ............... | 324/751 |
| 5,821,549 A | * | 10/1998 | Talbot et al. | ............... | 250/307 |
| 5,872,360 A | * | 2/1999 | Paniccia et al. | ............... | 324/753 |
| 6,020,746 A | * | 2/2000 | Livengood | ............... | 324/754 |
| 6,198,301 B1 | * | 3/2001 | Chetlur et al. | ............... | 324/769 |
| 6,255,124 B1 | * | 7/2001 | Birdsley | ............... | 438/14 |
| 6,352,871 B1 | * | 3/2002 | Goruganthu et al. | ........... | 438/18 |

* cited by examiner

*Primary Examiner*—Vinh P. Nguyen
(74) *Attorney, Agent, or Firm*—McDermott, Will & Emery

(57) ABSTRACT

A method is provided for obtaining an accurate image of a two-dimensional junction profile of a semiconductor device. Embodiments include sectioning a sample to be analyzed through the active transistor, either at a 90° angle to the planar surface or at a desired angle, as by a focused ion beam (FIB) apparatus. The sectioned transistor can be analyzed directly on the exposed silicon, or the exposed silicon of the cross-section can be passivated with a thin film material such as silicon dioxide, or with an undoped semiconductor material such as silicon or germanium. The electrodes (i.e., source, gate, drain and substrate electrodes) of the sample active transistor are then connected so they can be individually electrically biased. The prepared sample is placed in a conventional voltage contrast SEM, and the electrodes are selectively biased to produce a voltage contrast while being imaged by the voltage contrast SEM, thereby resulting in detailed SEM images of the active regions and depletion spreads.

19 Claims, 6 Drawing Sheets

METHOD FOR PROFILING SEMICONDUCTOR DEVICE JUNCTIONS USING A VOLTAGE CONTRAST SCANNING ELECTRON MICROSCOPE

RELATED APPLICATIONS

This application claims priority from U.S. Provisional Patent Application Ser. No. 60/162,141, filed on Oct. 29, 1999, entitled: "Voltage Contrast SEM Junction Profiling", the entire disclosure of which is hereby incorporated by reference herein.

This application contains subject matter similar to subject matter disclosed in copending U.S. Patent applications: Ser. No. 09/696,670, filed on Oct. 26, 2000.

FIELD OF THE INVENTION

The present invention relates to a method of analyzing a semiconductor device formed on a semiconductor substrate. The invention has particular applicability in analyzing junction profiles of semiconductor devices.

BACKGROUND ART

The measurement of junction depth of semiconductor devices is important for the design process. Transistor design is based on modeling and/or mathematical equations. These equations are based on physical properties, such as junction depth, or behavior. Historically, junction staining for one dimensional analysis was typically done by angle lapping and then staining the junction and measuring it. The staining process comprises applying a chemical etchant which will preferentially attack n+ doped material or p+ doped material, allowing the technician to delineate the location of the junction and measure its depth, etc.

Two dimensional junction depth measurement is necessary when submicron features are being formed, because many two dimensional electric field effects need to be accounted for. Various prior art chemical staining and Auger spectroscopy techniques have been used, but have definite limitations for submicron gate feature transistors.

Auger spectroscopy has "spot size" limitations and cannot deal with two-dimensional junction profiling. Auger spectrosopy is a form of scanning electron microscopy that analyzes spectra (i.e., energy) emitted from a surface, based on the principle that the energy emitted from a surface is indicative of the constituent material of the surface. The Auger equipment typically has a spot size of about one micron diameter and affects a depth typically several atoms or molecules thick. Thus, it cannot resolve the two dimensional junction profile of a junction depth smaller than one micron. This is problematic since junction depths are routinely on the order of one tenth of a micron. Auger spectroscopy has been successfully used for gross junction profiling where the specimen is angle lapped to yield accurate one dimensional information. However, it is not useful for performing two dimensional analysis.

Chemical staining is disadvantageous in that staining cannot be done in a depletion region since there are no free carriers. Thus, the depletion region edge does not coincide with the chemical junction edge. The chemical stain, which is an electrochemical activity, does not stain up to the junction. Therefore, actual junction depth cannot be measured, and erroneous results always occur. Furthermore, the longer the chemical etches the specimen, the deeper the junction becomes. In other words, the test affects the junction depth which is the object of measurement. Still further, the repeatability of this technique can be easily compromised if there is an error in the staining process.

Another problem with chemical staining relates to the fact that the stain is chemical doping, and the device operates because of activated doping. Thus, after chemical staining, doping is present that is not electrically active. Consequently, correct results cannot be achieved without performing additional, electrical measurements. Moreover, chemical staining does not reveal relative doping concentration, which is an extremely important parameter in transistor design. It will only detect the presence or absence of a dopant.

There exists a need for an effective methodology for accurately performing two dimensional junction profiling.

SUMMARY OF THE INVENTION

An advantage of the present invention is a method of obtaining an accurate image of a two-dimensional junction profile of a semiconductor device.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of inspecting a semiconductor device, the method comprising cross-sectioning the device to expose an active region to be inspected; electrically connecting the active region to a power source; and imaging the active region with a voltage contrast scanning electron microscope (SEM) to generate an image of the active region.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS.

Reference is made to the attached drawings, wherein elements having the same reference numeral designations represent like elements throughout, and wherein.

DESCRIPTION OF THE INVENTION

Figure 1:
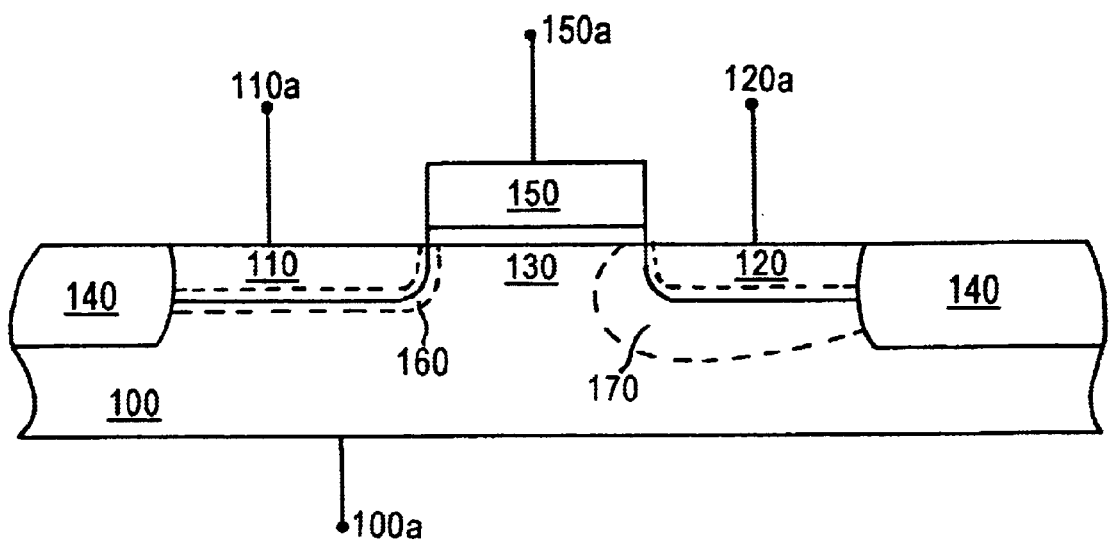
FIG. 1 schematically illustrates a cross-sectioned semiconductor device to be inspected with the methodology of the present invention.

Conventional methodologies for profiling semiconductor junctions in two dimensions do not yield accurate results.

The present invention addresses and solves these problems stemming from conventional junction profiling techniques.

According to the methodology of the present invention, a sample to be analyzed is sectioned through the active transistor, either at a 90° angle to the planar surface or at a desired angle, as by a focused ion beam (FIB) apparatus. The sectioned transistor can be analyzed directly on the exposed silicon, or the exposed silicon of the cross-section can be passivated with a thin film material such as silicon dioxide, or with an undoped semiconductor material such as silicon or germanium. The electrodes (i.e., source, gate, drain and substrate electrodes) of the sample active transistor are then connected so they can be individually electrically biased. The prepared sample is placed in a conventional voltage contrast SEM, and the electrodes are selectively biased to produce a voltage contrast while being imaged by the voltage contrast SEM, thereby resulting in detailed SEM images of the active regions and depletion spreads.

The present invention will now be described in detail. The sample to be analyzed can be a standard test chip, or "technology development test chip", or can be a purpose-built chip. The sample is sectioned through the active transistor, either at a 90° angle to the planar surface or at a desired angle, as by a conventional focused ion beam (FIB) apparatus. Once sectioned, the transistor can be analyzed directly on the exposed silicon, or the exposed silicon of the cross-section can be passivated with a thin film material such as silicon dioxide by thermal oxidation or deposition, silicon nitride or other insulator by deposition, or with undoped semiconductor material such as carbon, silicon, or germanium by deposition. The passivation layer allows observation of the changing potential through, for example, an oxide layer. It is also useful for making sure there is no surface contamination of the wafer due to exposure to oxygen in the air.

The edge of the sectioned device will behave differently than designed because it has been sectioned. Thus, it could be desirable to modify its behavior by applying a passivation layer of a different material that allows the potential on the device to occur while enabling it to be read; e.g., through a semiconductor thin film with an SEM probe. Moreover, it can be desirable to form a silicon dioxide passivation layer on one sample, and form an undoped semiconductor material such as carbon, silicon or germanium on another sample. For example, the dielectric coefficient of silicon is about 11 and that of silicon dioxide is about 4. Therefore, a silicon nitride, amorphous carbon or silicon passivation layer having a dielectric coefficient of about 8 can be applied to match that of silicon.

The concern addressed by the choice of passivation layer is so-called "band bending" at the sectioned surface. When a device is sectioned, as to practice the present invention, the depletion spread is different than expected, because the dielectric coefficient in an air vacuum is different than that in bulk silicon. Thus, for a given applied potential, the change in the device's dielectric constant results in a depletion spread having different dimensions than the circuit designer intended, since the sectioned surface is not the same as it is in the bulk silicon. This band bending phenomenon is well known in the art, and can be calculated and compensated for using conventional techniques, and/or can be affected by the presence of a passivation layer. In other words, when practicing the present invention, the extent and effect of the band bending will depend on whether or not the silicon of the sectioned edge is left bare or coated with a thin film layer. Band bending will be discussed in greater detail below.

After sectioning, to obtain the necessary electrical connections to its electrodes, the sectioned transistor can be packaged in a conventional way, or the device can be fixtured and the bonding pads on the die contacted with microprobes The sample is then placed into a coventional voltage contrast SEM. Referring now to FIG. 1, the sectioned device comprises substrate 100, source region 110, drain region 120, channel region 130, field oxide regions 140, and gate 150. Substrate electrode 100a is in electrical contact with substrate 100, source electrode 110a is in electrical contact with source 110, drain electrode 120a is in electrical contact with drain 120, and gate electrode 150a is in electrical contact with gate 150. With the voltage contrast SEM imaging the cross-section, the four electrodes, 100a, 110a, 120a and 150a may be biased with voltage selectively in order to achieve voltage contrast. A negatively charged electrode will repel electrons, so it will appear to be bright in the SEM picture. Conversely, if an electrode is positively charged it will attract electrons, so it will appear dark. Thus, because a voltage contrast exists between the doped regions (e.g., an n+ region 110 or 120) and substrate 100, the depletion spread will appear as shades of gray between light and dark regions in the remainder of the device structure.

For example, in FIG. 1, depletion spreads 160 and 170 (between the dotted lines) are illustrated at source 110 and drain 120, respectively; source 110 showing the depletion spread 160 at zero volts bias and drain 120 showing the depletion spread 170 at a positive voltage bias. In the case of source 110, no voltage contrast will be evident due to no voltage applied. In the case of positively biased drain 120, the n+ (undepleted) region 120 will be uniformly dark (dependent on bias applied to this electrode), and it will be uniform in contrast up to the top edge of the depletion region 170 (i.e., the upper dotted line). Contrast will lighten on a gradient basis until the lower edge of the depletion region 170 is reached (i.e., the lower dotted line). The lighter contrast shade will be uniform below the boundary of depletion region 170. In this way, the present invention enables the depletion width to be accurately observed at the resolution limit of the SEM; that is, typically at an accuracy of less than 100 Å. As the applied voltage is varied on drain electrode 120, the depletion width will change accordingly, thus enabling accurate two dimensional depletion region observation as a function of drain voltage. Thus, critical two dimensional behavior can be observed and compared with device computer modeling simulations. This feedback is vital to improving computer model calibration.

Transistor gate electrode 150a may also be biased, which will affect the drain diffusion two dimensional depletion spread 170, particularly in close proximity to the drain 120/gate 150 edge region. This enables further improvement in device understanding and, as a result, improved device modeling.

Figure 2A:
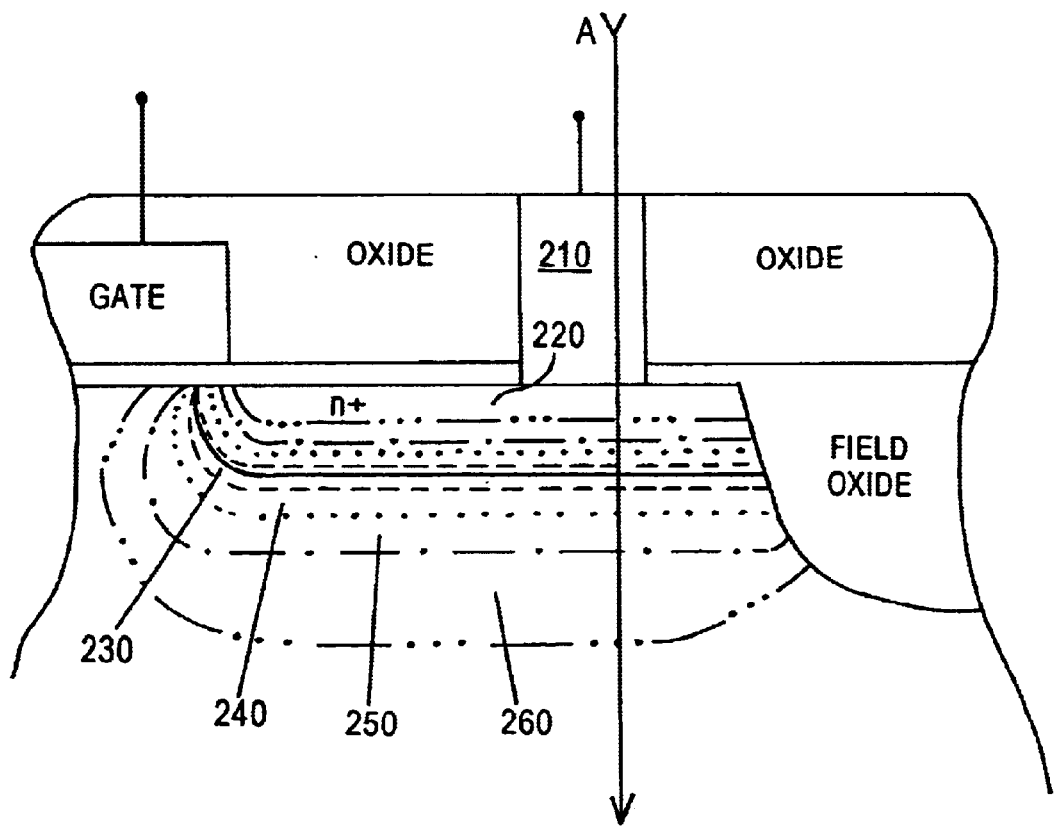
FIGS. 2A–2B graphically illustrate the results of the methodology of an embodiment of the present invention.
Figure 2B:
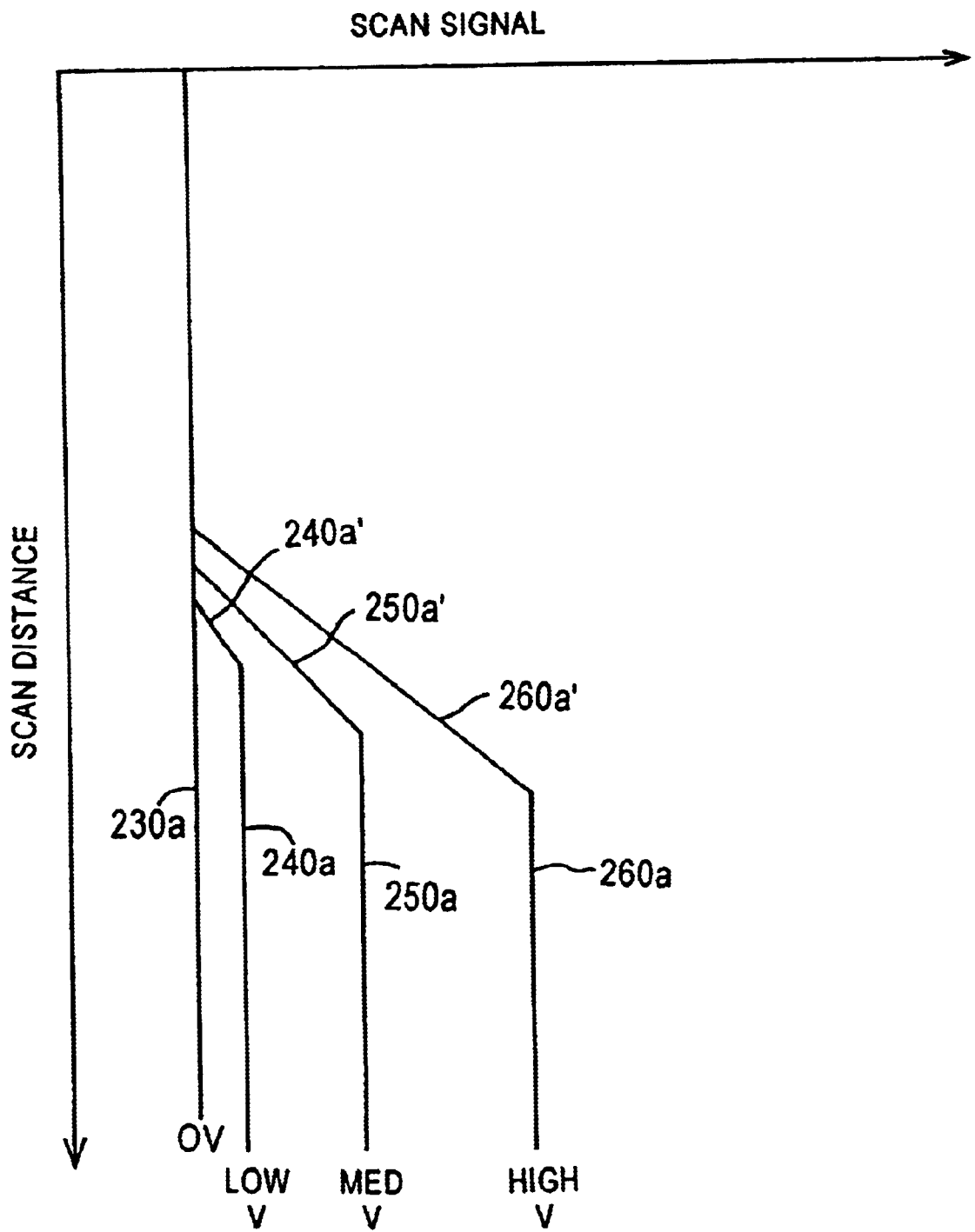

In a further embodiment of the present invention, conventional electron beam or "E-beam" microprobe techniques are combined with the voltage contrast SEM methodology of the present invention. In this embodiment of the present invention, the detector signal output from the voltage contrast SEM is recorded as a raster signal for two dimensional mapping of the device cross-section. This information can be digitized for subsequent computer signal processing. For example, by extending the single SEM scan path represented by arrow A of FIG. 2A into a raster scan using conventional techniques, a two dimensional profile of the depletion spread measurement as shown in FIG. 2B is obtained, using the potential profile, the applied voltage and the x-y coordinates on the sample cross-section. Referring now to FIG. 2A, arrow A runs down through the source/drain contact 210, the n+ region 220 and through the various depletion spreads 230–260. Of course, only one of depletion spreads 230–260 will be present at any given time. As the voltage contrast SEM is scanned along arrow A's scan path, the result is a scan signal exhibiting a different response depending on the voltage applied to source/drain contact 210. If the scan is rastered (i.e., the path of arrow A repeated while successively moving to the right or left) while a voltage is applied to contact 210 and the scan signal response recorded, the result is a two dimensional representation of the depletion spread at a given voltage. If the scan is repeated for several different voltage applications to contact 210, the result is essentially a quasistatic look at how the source/drain junction changes with voltage.

FIG. 2B graphically illustrates multiple raster scans of the device of FIG. 2A, plotting scan signal strength (x-axis) versus scan distance (y-axis). When the voltage at contact 210 is set to zero (corresponding to depletion spread 230) and the entire image of the device in FIG. 2A is scanned, the result is the line 230a of FIG. 2B. When the voltage at contact 210 is set to a low voltage, for example, half a volt (corresponding to depletion spread 240) and the entire image of the device in FIG. 2A is scanned, the result is the line 240a of FIG. 2B. When the voltage at contact 210 is set to a medium voltage, for example, ¾ volts (corresponding to depletion spread 250) and the entire image of the device in FIG. 2A is scanned, the result is the line 250a of FIG. 2B. When the voltage at contact 210 is set to a higher voltage, such as one volt (corresponding to depletion spread 260) and the entire image of the device in FIG. 2A is scanned, the result is the line 260a of FIG. 2B. Thus, FIG. 2B illustrates the scan signal obtained applying zero voltage, low voltage, medium voltage, and high voltage on contact 210. As shown in FIG. 2B, the point at which each of scan signal lines 240a, 250a, 260a intersect zero voltage line 230a is different, showing that the depletion spread forms at a different location with different voltage applications. The intersection of sloping part 240a'–260a' of each line 240a–260a with zero volt line 230 represents one end of each of the depletion regions 240, 260, and the point where sloping part 240a'–260a' changes to a line having the same slope as zero line 230 represents the other end of each of the depletion regions 240–260. Thus, one can determine how far depletion regions 240–260 extend up into n+region 220, and how far they extend down into substrate 200.

Additional information for analyzing depletion spread data can be obtained from conventional one dimensional doping profiles, normally obtained via the spreading resistance profile (SRP) method, secondary ion mass spectrometry (SIMS), or other methods. These conventional methods, although prone to error, provide a starting point for analysis. Several of these may be utilized along with the techniques of the present invention depending on the problem to be analyzed. Two dimensional computer analysis, such as "TCAD" analysis, may also be used to initially estimate the two dimensional doping profiles.

Figure 3A:
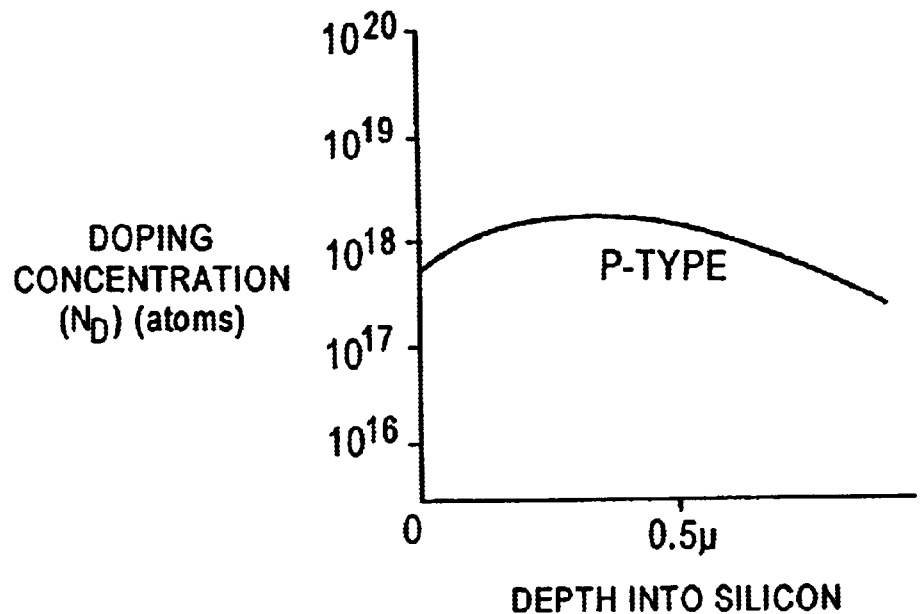
FIGS. 3A–3C graphically illustrate doping profiles employed when practicing an embodiment of the present invention.
Figure 3B:
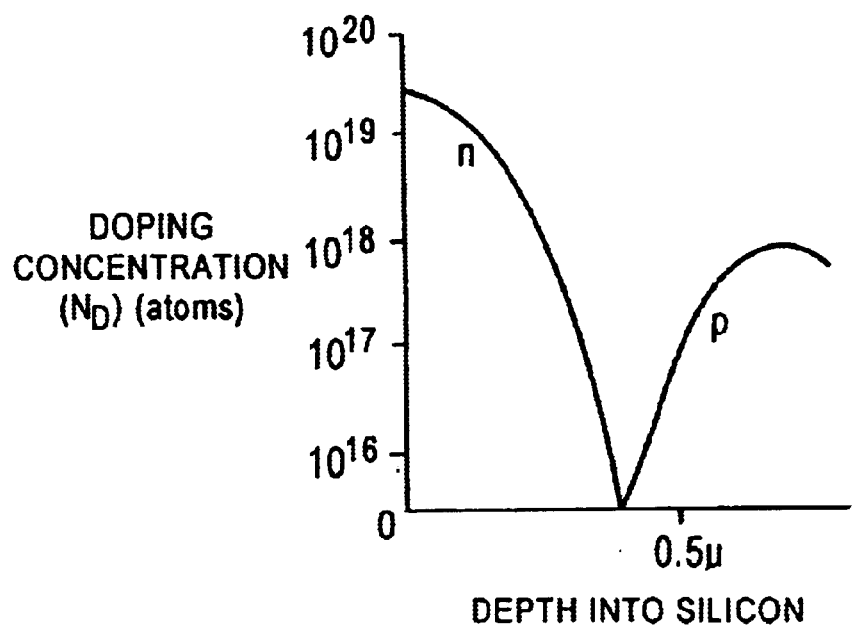
Figure 3C:
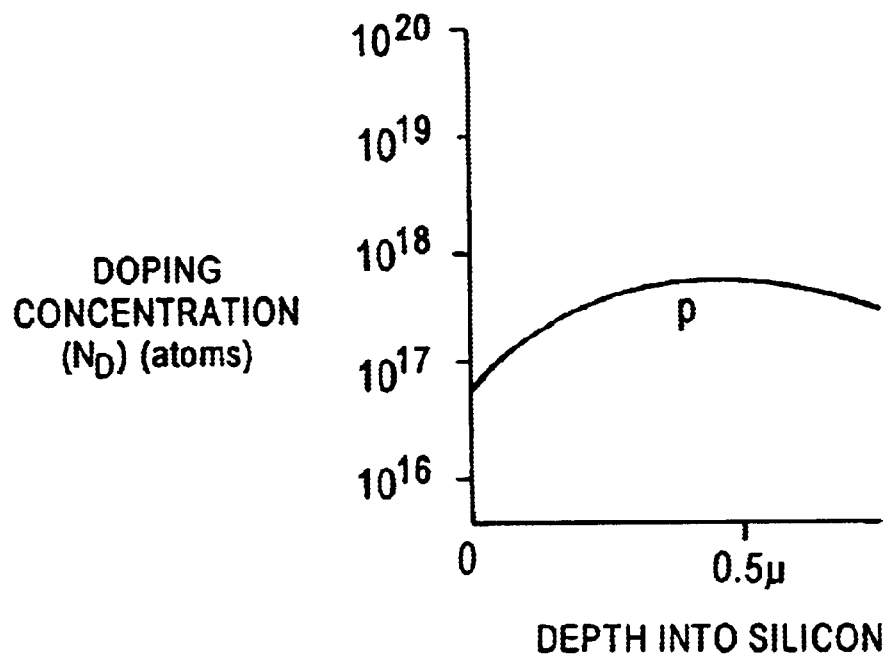
Figure 4A:
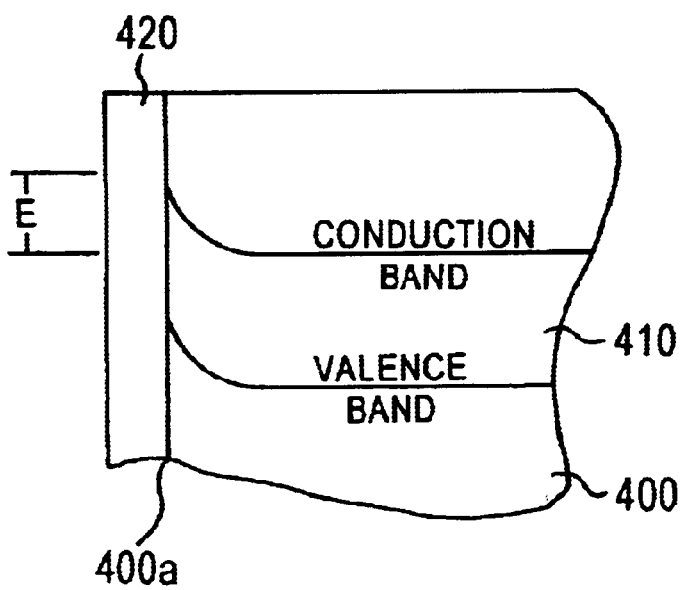
FIGS. 4A–4B graphically illustrate surface band-bending occurring when practicing the present invention.
Figure 4B:
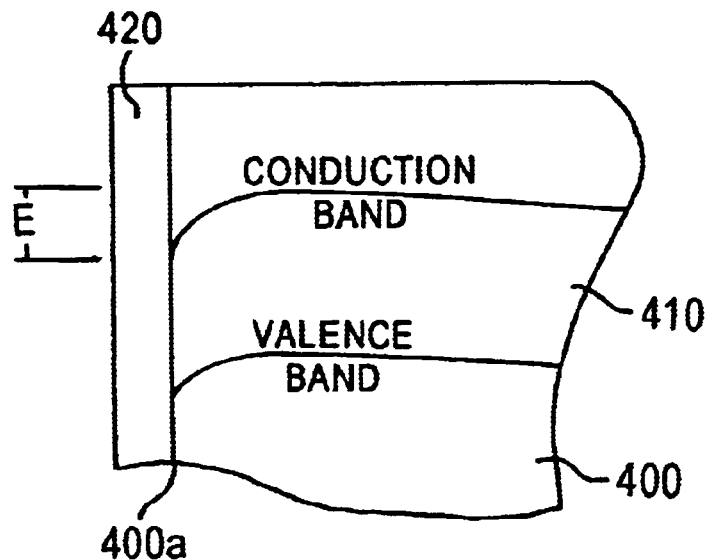

For example, FIGS. 3A–3C show exemplary doping profiles under the gate, under the n+ source/drain region, and under the field oxide, respectively, of a typical transistor to be analyzed. As discussed above, a difficulty in sectioning through an active transistor and attempting to measure surface voltage on the sample section is energy band-bending from bulk to surface. Band-bending is a function of surface states (e.g. silicon/silicon dioxide), charge trapping, and most importantly, the doping level. Band bending occurs least with high doping and occurs most at low doping, and creates errors which must be corrected for accurate junction depth measurement. When the doping levels are known, as shown in FIGS. 3A–C, computational correction can be accurately performed. FIGS. 4A and 4B illustrate band-bending in sectioned n-type and p-type semiconductor devices, respectively, which will create errors of surface depletion spreads correctable by computation. As shown in FIGS. 4A and 4B, the shape of the depletion spread 410 distorts proximal to the sectioned edge 400a of substrate 400, which is shown with a thin film passivation layer 420 applied, such as an oxide layer. The error in the conduction band to be corrected for using conventional techniques is shown as reference character "E". Well-known SRP measurements require the same type of computational correction. Knowledge of the doping profile (as in FIGS. 3A–C) is helpful for greater accuracy when practicing the present invention, but not absolutely necessary.

Figure 5A:
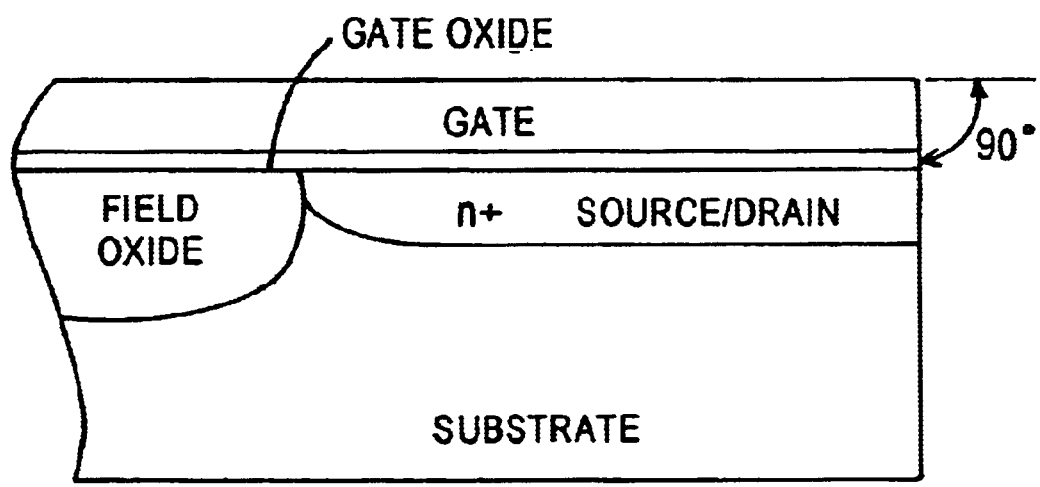
FIGS. 5A–5B schematically illustrate alternate embodiments of the present invention.
Figure 5B:
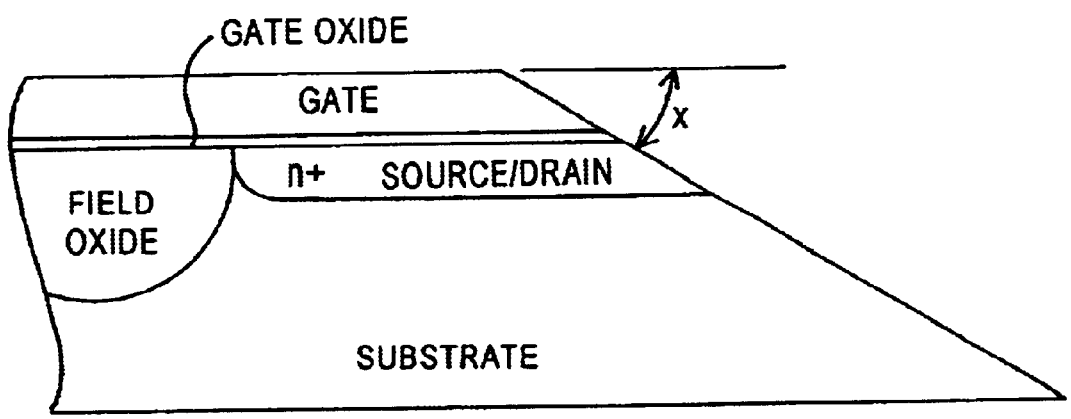

In another embodiment of the present invention, resolution enhancement is accomplished through the geometry of the cross-section of the inspected device. Although a 90° angle section as shown in FIG. 5A is most common, using a shallower angle x for the sample section, as shown in FIG. 5B, can improve junction depth resolution with SEM voltage contrast techniques by mitigating band-bending effects. The shallower the angle, the greater the depletion spread resolution. Band-bending on angled surfaces is different than on 90° angled samples, but this can be included in computational corrections similar to conventional techniques for correction of SRP measurements that use various lap angles for sample preparation.

The present invention is applicable to the inspection and analysis of various types of semiconductor devices, particularly high density semiconductor devices having a design rule of about 0.18µ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of inspecting a semiconductor device, the method comprising:
   cross-sectioning the device to expose an active region to be inspected;
   electrically biasing the active region with a voltage; and
   imaging the active region with a voltage contrast scanning electron microscope (SEM) to generate an image of the active region.

2. The method of claim 1, comprising sectioning the device at an angle of about 90 degrees.

3. The method of claim 1, comprising sectioning the device at an angle shallower than 90 degrees.

4. The method of claim 1, comprising sectioning the device using a focused ion beam apparatus.

5. The method of claim 1, comprising forming a passivation layer on the exposed active region prior to the imaging step.

6. The method of claim 5, wherein the passivation layer comprises an insulating material.

7. The method of claim 6, wherein the passivation layer comprises silicon dioxide formed by thermal oxidation or deposition.

8. The method of claim 6, wherein the passivation layer comprises silicon nitride.

9. The method of claim 5, wherein the passivation layer comprises an undoped semiconductor material.

10. The method of claim 9, wherein the passivation layer comprises carbon, silicon or germanium.

11. The method of claim 5, comprising forming the passivation layer such that effects of band bending are reduced.

12. The method of claim 1, wherein the active region comprises a pair of source/drain regions each having an electrical contact, and the sectioned device further comprises a gate having an electrical contact and a substrate having an electrical contact, the method comprising packaging the device such that each of the source/drain contacts, the gate contact and the substrate contact can be selectively electrically biased.

13. The method of claim 1, wherein the active region comprises a pair of source/drain regions each having an electrical contact, and the sectioned device further comprises a gate having an electrical contact and a substrate having an electrical contact, the method comprising fixturing the device such that each of the source/drain contacts, the gate contact and the substrate contact can be selectively electrically biased.

14. The method of claim 1, comprising biasing the active region with the voltage to generate a depletion spread, and imaging the depletion spread with the voltage contrast SEM.

15. The method of claim 14, wherein the sectioned device further comprises a gate having an electrical contact, the method comprising biasing the gate with a gate voltage.

16. The method of claim 1, wherein the imaging step includes raster scanning the active region with the voltage contrast SEM.

17. The method of claim 16, wherein the voltage contrast SEM generates a scan signal strength during the raster scan, and the raster scan is conducted over a scan distance, and wherein biasing the active region comprises biasing the active region with a first voltage to generate a first depletion spread, the method comprising:

performing a first raster scan of the active region; and generating a graphical representation of the scan signal strength versus the scan distance for the first raster scan.

18. The method of claim 17, wherein biasing the active region comprises biasing the active region with a second voltage different from the first voltage to generate a second depletion spread, the method comprising:

performing a second raster scan of the active region; and generating a graphical representation of the scan signal strength versus the scan distance for the second raster scan.

19. The method of claim 1, comprising compensating for effects of band bending using computational correction prior to generating the image of the active region.

* * * * *